(12) United States Patent
Mascolo et al.

(10) Patent No.: US 8,212,234 B2
(45) Date of Patent: Jul. 3, 2012

(54) METHOD OF FABRICATING NANOSIZED FILAMENTARY CARBON DEVICES OVER A RELATIVELY LARGE-AREA

(75) Inventors: Danilo Mascolo, Ercolano (IT); Maria Fortuna Bevilacqua, Gragnano (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 0 days.

(21) Appl. No.: 13/269,923

(22) Filed: Oct. 10, 2011

(65) Prior Publication Data
US 2012/0025166 A1   Feb. 2, 2012

Related U.S. Application Data

(62) Division of application No. 12/627,426, filed on Nov. 30, 2009, now Pat. No. 8,048,785.

(30) Foreign Application Priority Data

Dec. 12, 2008   (IT) .......................... VA2008A000061

(51) Int. Cl.
*H01L 29/06* (2006.01)

(52) U.S. Cl. . 257/9; 257/4; 257/E29.168; 257/E21.101; 438/503; 438/99; 438/669; 977/890; 977/901; 977/742

(58) Field of Classification Search ................... 257/9, 4, 257/E29.168, E21.101; 438/503, 99, 669; 977/890, 901, 742
See application file for complete search history.

(56) References Cited

U.S. PATENT DOCUMENTS

| 7,279,433 | B2 | 10/2007 | Ventzek et al. ............... 438/778 |
| 2003/0098488 | A1* | 5/2003 | O'Keeffe et al. ............. 257/401 |
| 2006/0192231 | A1 | 8/2006 | Nihei ............................. 257/260 |
| 2008/0029371 | A1 | 2/2008 | Yoon et al. ..................... 200/181 |
| 2010/0171099 | A1* | 7/2010 | Tombler et al. ................. 257/40 |

OTHER PUBLICATIONS

Choi et al., "Ultrahigh-density nanotransistors by using selectively grown vertical carbon nonotubes", Applied Physics Letters, AIP, American Institute of Physics, Melville, NY, Nov. 2001, pp. 3696-3698.
El-Hami et al., "Alignment of Different Lengths of Carbon Nanotubes Using Low Applied Electric Field", IEICE Transactions on Electronics, Electronics Society, Tokyo, Japan, vol. E87-C, No. 12, Dec. 2004, pp. 2116-2118.

* cited by examiner

*Primary Examiner* — Tu-Tu Ho
(74) *Attorney, Agent, or Firm* — Allen, Dyer, Doppelt, Milbrath & Gilchrist, P.A.

(57) ABSTRACT

Nanosized filamentary carbon structures (CNTs) nucleating over a catalyzed surface may be grown in an up-right direction reaching a second surface, spaced from the first surface, without the need of applying any external voltage source bias. The growth process may be inherently self-stopping, upon reaching a significant population of grown CNTs on the second surface. A gap between the two surfaces may be defined for CNT devices being simultaneously fabricated by common integrated circuit integration techniques. The process includes finding that for separation gaps of up to a hundred or more nanometers, a difference between the respective work functions of the materials delimiting the gap space, for example, different metallic materials or a doped semiconductor of different dopant concentration or type, may produce an electric field intensity orienting the growth of nucleated CNTs from the surface of one of the materials toward the surface of the other material.

29 Claims, 11 Drawing Sheets

METHOD OF FABRICATING NANOSIZED FILAMENTARY CARBON DEVICES OVER A RELATIVELY LARGE-AREA

RELATED APPLICATION

This application is a divisional of Ser. No. 12/627,426 filed Nov. 30, 2009, now U.S. Pat. No. 8,048,785 the entire disclosure of which is hereby incorporated herein by reference.

FIELD OF THE INVENTION

The present disclosure relates in general to nanosized filamentary carbon structures, typically carbon nanotubes (mono or multi walled) and/or carbon nanowires, (CNTs), and related functional devices. In particular, to a method of growing oriented nanosized filamentary carbon structures, typically carbon nanotubes (mono or multi walled) and/or carbon nanowires (CNTs) over defined areas of a relatively large substrate with techniques that are commonly practiced in the semiconductor manufacturing industry to enable integration of active or passive CNT parts in electronic devices.

BACKGROUND OF THE INVENTION

The mainstream of semiconductor industry progress is primarily driven by the ability of shrinking the size of basic structures of an integrated circuit (IC), for example, the metal oxide semiconductor field effect transistor (MOSFET). New materials of peculiar electrical and physical characteristics, in addition to the traditional materials of microelectronics and development of new concepts of operation, are considered essential in the latest version of the International Technology Roadmap for Semiconductors (ITRS)—2005 Edition, available from www.itrs.org. Among the identified materials, CNT devices are emerging as fundamental building blocks for a potentially new, cost-effective, nano-electronics science.

Since their discovery by S. Iijima, see for example, "Helical microtubes of graphitic carbon", Nature vol. 354, pp. 56-58, (1991), CNTs have been a popular research topic for their unique chemical, physical, and electrical properties. A few properties of great impact on micro- and nano-electronics applications are: (1) metallic and semiconducting electrical behavior with size in the nanometer scale length; (2) outstanding charge transport properties due to intrinsic mono-dimensionality that drastically reduces scattering and consequent power dissipation; (3) chemical passivation of their surface is generally not required, thus allowing use of a high-K dielectric; and (4) chemical and thermal stability and resistance to electro-migration at a current density in the order of $10^9$ A/cm2.

Detailed reviews on these topics can be found in M. S. Dresselhaus, G. Dresselhaus and P. C. Eklund, Science of fullerenes and Carbon Nanotubes, Academic Press (1996), P. Avouris, J. Appenzeller, R. Martel and S. J. Wind "Carbon Nanotube Electronics" Proced. IEEE Vol. 91, N 11, November 2003, in "Carbon Nanoture Electronics and Optoelectronics" published in MRS Bulletin June 2004 page 403 by P. Avouris, or in "Properties and applications of high-mobility semiconducting nanotubes" published by T. Dürkop, B. M. Kim and M. S. Fuhrer in J. Phys.: Condens. Matter 16 (2004) R553-R580 and "Physics of carbon nanotube electronic devices" by M. P. Anantram and F. L'eonard in Rep. Prog. Phys. 69 (2006) 507-561.

A major hurdle to be overcome for CNTs to find prominent uses in ICs is to develop fabrication techniques that may be compatible with present ICs fabrication processes. The IC fabrication processes are based on few elementary steps: films are deposited onto a wafer and pattern-etched away through photolithographic definition steps. The technique of fabricating nanotubes and/or nanowires that has the potential of enabling their integration in solid state devices appears to be based on Catalyzed Chemical Vapor Deposition (CCVD). The formation process starts from patterned catalyzed areas of a substrate, over which nano and/or sub-nano particles of a catalyst (promoter), usually nano-particles of transition metals such as of iron (Fe), carbon monoxide (Co), nickel (Ni), molybdenum (Mo) and alloys of the metals, are finely dispersed in order to act as initiation sites of CNTs nucleation. Usually a "flash" deposition of the metal catalyst over the surface of the substrate is effective in establishing thereon a uniform dense population of closely spaced (discrete) nano-particles constituting the nucleation sites of CNTs over the catalyzed area.

Different hydrocarbons such as benzene (C6H6), pentane (C5H12), acetylene (C2H2), methane (CH4) and even carbon monoxide (CO), may be catalytically decomposed at temperatures between 500 and 1200° C. in the presence of a carrier gas like H2, Ar, and NH3. The method allows both single-wall nanotube (SWNT) and multi-walled nanotube (MWNT) growth with the process at different ranges of temperatures. See for example, "Growth of carbon nanotubes by Fe-catalyzed chemical vapor processes on silicon based substrates", R. Angelucci, R. Rizzoli, M. F. Bevilacqua, V. Vinciguerra, submitted to Journal of Physical E: Low-dimensional Systems and Nanostructures (2006); "Carbon Nanotubes Grown by Catalytic CVD on Silicon Based Substrates for Electronics Applications", R. Rizzoli, R. Angelucci, S. Guerri, A. Parisini, G. P. Veronese, V. Vinciguerra, M. F. Bevilacqua, submitted to Advanced Materials Research (2006); "Patterned growth of carbon nanotubes synthesized by Fe-catalyzed chemical vapor deposition", V. Vinciguerra, M. F. Bevilacqua, R. Angelucci, R. Rizzoli, Chemistry Today, October 2004; and "Carbon Nanotubes: Synthesis and Applications", R. Angelucci, R. Rizzoli, F. Corticelli, A. Parisini, V. Vinciguerra, M. F. Bevilacgua, L. Malferrari and M. Cuffiani, IAEA Technical Report, April 2004.

The CCVD process conditions can be those of thermal activation (CVD), plasma enhancement (PECVD) or microwave enhancement (MWCVD). See for example, "Carbon nanotube growth by a review" by M. Meyyappan, Lance Delzeit, Alan Cassell and David Hash, published in Plasma Sources Sci. Technol. 12 (2003) 205-216; and "Growth of carbon nanotubes by thermal and plasma chemical vapor deposition processes and applications in microscopy" by Lance Delzeit, Cattien V. Nguyen, Ramsey M. Stevens, Jie Han and M. Meyyappan in Nanotechnology 13 (2002) 280-284. During the growth, an external electric field is applied to direct the growth of the tubes along field lines from negative to positive polarity. See H. B. Peng at al., APL (2003) Vol. 83 page 4238.

It is also known that by using a substrate/buffer-layer/catalyst-layer stack, a certain control of the growth of CNTs can be implemented on the basis of pre-conditions established by stack composition. The metal catalyst can be deposited by physical procedures (sputtering, e-gun, or resistive evaporation) or by chemical solutions (starting from precursors of the metal catalyst), and eventually patterned in well-defined areas by an appropriate mask. Depending on the method and conditions of the catalyst deposition, the size of the CNTs may be substantially controlled. Whether the catalyst is sputtered, deposited from vapor phase or by thermal reduction of a decomposable salt solution applied on the surface to be catalyzed, the more the amount of the catalyst, the larger the size of deposited metal particles or of metal particle clusters, and generally larger will be the diameters of the grown CNTs. In any case the amount of catalyst metal is kept (the "thickness" of the deposited catalyst layer) well below a certain critical thickness that generally may be between 10 and 1000 Å. Size and density of the catalyst particles play an important role, together with the carbon deposition conditions, in the formation of either single or multi-wall shell nanotubes. See, for example, "Diameter-controlled synthesis of Carbon Nanotubes", J. Phys. Chem. B 106 (2002) 2429-2433 by Chin Li Cheung, Andrea Kurtz, Hongkun Park, Charles M. Lieber. If the catalyst is deposited by chemical deposition, the concentration of precursor salts of the catalytic metal in the solution usually controls the average sizes of the deposited metal particles that determine the sizes of the grown nanosized filamentary carbon structures (CNTs).

PCT Patent Application Publication No. WO2005102922 to Philips, and the article "A self-assembled synthesis of carbon nanotubes for interconnects", Nanotechnology, 17, (2006) pages 1062-1066, by Zexiang Chen, Guichuan Caol, Zulun Lin, Irmgard Koehler and Peter K Bachmann, disclose how to grow highly oriented, freestanding and structured CNTs by Plasma-Enhanced CVD. According to this method, an array of multi-layered structures, each multi-layer including a substrate, a bottom electrode, a buffer layer, a catalyst layer, a second buffer layer and a top electrode, is defined by standard deposition techniques. A MWPECVD is then used to activate nucleation and growth of the CNTs. The technique permits lifting of the top electrode during the growth phase. The technique suffers in that the heavy top electrode may distort the growing CNTs and is scarcely equipped to determine, a priori, the exact lengths of the grown CNTs when fabricating multiple structures (CNT devices), a requisite for mass-production applications. Moreover the use of metal electrodes for biasing the stack imposes a maximum temperature limit to the CNT's growth process.

In CVD growth processes, application of an electric field assists the nucleation and orients the growth along the field lines, typically from lower to higher potential. See, for example, "Electric-field-directed growth of aligned single-walled carbon nanotubes", Y. Zhang, A. Chang, J. Cao, Q. Wang, W. Kim, Y. Li, N. Morris, E. Yenilmez, J. Kong and H. Dai, Appl. Phys. Lett. 79, 3155-3157 (2001), "Vectorial growth of metallic and semiconducting Single-Wall Carbon Nanotubes", E. Joselevich and C. Lieber, NanoLetters 2, 1137-1141 (2002), "Electric-field-aligned growth of single-walled carbon nanotubes on surfaces", A. Ural, Y. Li and H. Dai, Appl. Phys. Lett. 81, 3464-3466 (2002), and "Electric-field-directed growth of carbon nanotubes in two dimensions", A. Nojeh, A. Ural, R. F. Pease and H. Dai, J. Vac. Sci. Technol. B 22, 3421-3425 (2004).

SUMMARY OF THE INVENTION

An effective way of growing nanosized filamentary carbon structures, typically carbon nanotubes (mono or multi walled) and/or carbon nanowires (CNTs) nucleating over a surface and growing in a substantially up-right direction, or more precisely in a direction orthogonal to the surface, as far as reaching a second surface, spaced from the first surface, and without the need of applying an external voltage source bias, has been found by the applicants.

Besides obviating the inherent complications, limitations, and problems due to the presence of opposite electrodes for applying, with an external source, a growth-orienting electric field across the region of growth of the CNTs, the growth process found by the applicants is inherently "self-stopping", upon the reaching by a significant population of grown CNTs the second surface. The gap between the two opposite surfaces may thus be uniformly defined for all the CNT devices being fabricated by common integration techniques of ICs.

The process of this disclosure rests on the applicants finding that, for separation gaps in the order of up to a hundred or even more nanometers, a substantial difference of the respective work functions of the materials delimiting the gap space, across which oriented CNTs are to be grown, such as, for example, different metallic materials or a doped semiconductor of sufficiently different dopant concentration or of a different type of dopant, is capable of producing, by the so-called Volta effect, or contact potential difference, an electric field intensity sufficient to effectively orient the growth of nucleated CNTs from the surface of one of the materials toward the surface of the other material. For a gap of 100 nm, a difference in work function values of about 0.5 eV produces an electric field intensity of about 5 V/µm and this condition proves itself to be an adequate electric field bias for orienting the growth of CNTs. Indeed, the minimum electric field intensity capable of ensuring an effective growth-orientation bias may be found to be in the vicinity of 0.2 V/µm. Thus, a 0.5 eV difference between the work function values of the materials of the two spaced layers would permit growth of oriented CNTs across a gap as large as 2.5 µm.

According to an embodiment of the method, an effective self-generated electric field is ensured by fabricating an adequate multilayer stack of selected materials of dielectric, conductive or semiconductive characteristics and compatible dimensional parameters, patterning the stack through common lithographic techniques, and isotropically (wet) etching a sacrificial dielectric layer of separation of electrically conductive or semiconductive layers of an adequately different work function, as far as slenderizing a residual part of the sacrificial dielectric separator to a mechanical sustaining pillar or wall, before performing the CNTs growth process. The two spaced electrically conductive or semiconductive layers may both be polysilicon (short for polycrystalline silicon), doped, for example, one with a dopant capable of imparting a first type of conductivity, and the other with a dopant capable of imparting an opposite type of conductivity, or doped with dopants imparting the same type of conductivity, but in sufficiently different concentrations such to determine sufficiently different work function values. Alternatively, effective spaced electrically conductive layers, between which oriented CNTs may be grown, may be of different metallic materials. The pair of materials of sufficiently different work function values may be selectable among carbon monoxide (Co), iron (Fe), nickel (Ni), tungsten (W), platinum (Pt), gold (Au), and alloys of the same metals. The separating dielectric layer of thickness in the order of hundreds of nanometers may be of any selectively wet etchable material, for example, an oxide or a nitride, preferably though not necessarily silicon.

Practically, once the dielectric spacer material has been wet-etched off from a certain area, the spaced doped polysilicon or metallic layers behave, by the contact potential difference, as biasing electrodes for growing therebetween, electrically conductive CNTs. The electrically conductive CNTs may be oriented from a surface that, according to an embodiment may be suitably catalyzed, from the layer at lower potential toward the surface of the layer at higher potential that optionally may also be similarly catalyzed. The catalytic chemical vapor deposition of carbon from a suitable carbon feedstock may be conducted in the presence of a vapor phase catalytic compound, an alternative to a pre-catalyzation of one or of both surfaces of the opposite layers, or in association with the pre-catalyzation of the spaced layer surfaces.

The stack may be defined by photolithographic masking steps and precisely patterned by an anisotropic dry etch step (e.g. by plasma etch) or by any other equivalent lithographic definition technique. Eventually the two spaced layers, or one of the two, may inherently constitute an operative electrical contact (terminal) of an integrated CNT structure.

The fact that the electric field orienting bias during the growth process of the CNTs is self-generated by the contact potential difference makes the process of oriented growth self-stopping on account of the fact that the orienting field rapidly decays to zero when a significant population of the growing CNTs "short circuits" the two electrodes making the whole structure having an equal potential.

DETAILED DESCRIPTION OF THE PREFERRED EMBODIMENTS

The following description made with direct reference to the attached drawings is intended only for illustrative, not limiting, purposes and reports only exemplary embodiments, and, when so-stated, certain preferred choices of materials, techniques and conditions used. The invention may be practiced in many alternative ways to the exemplarily detailed ones, as will immediately appear to the skilled reader.

Figure 1:
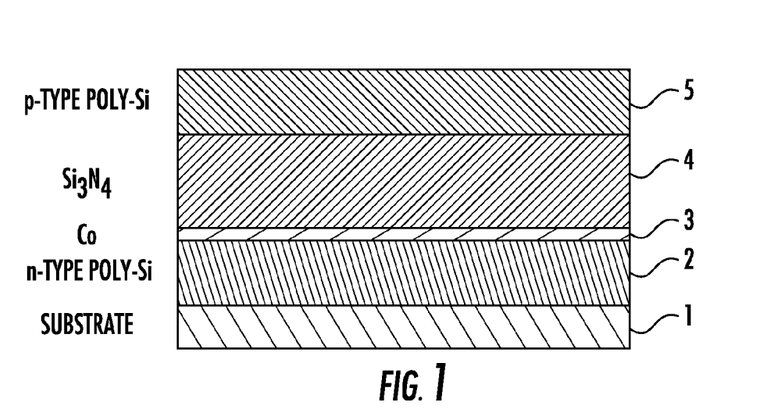
FIGS. 1 to 5 illustrate basic steps of a process of growing CNTs according to an embodiment of the present invention.
Figure 2:
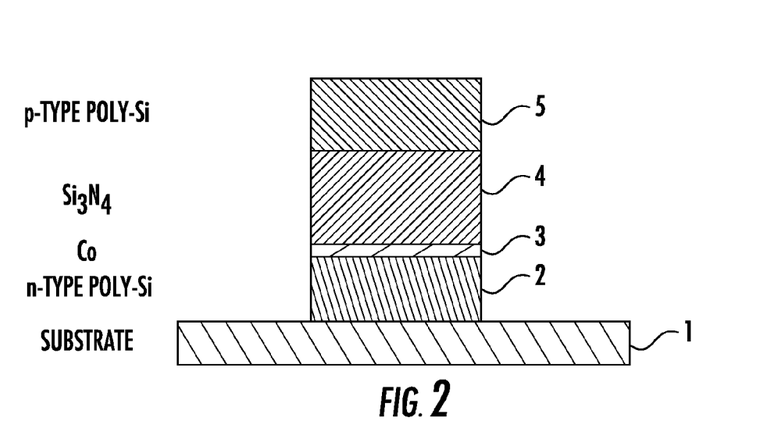

FIG. 1 schematically illustrates a basic multilayer stack that may be preliminarily formed for eventually forming a CNT in lithographically definable parts of the so-patterned stack. Although in many specific embodiments of the method, a substrate may not be required. In the exemplary general illustration of FIG. 1, a solid substrate 1 is shown having a generally flat surface. The optional substrate 1 may be of one of innumerable suitable materials such as monocrystalline silicon, polycrystalline silicon, silica, alumina, porous monocrystalline silicon, zeolite sapphire, stainless steel, a Hastelloy, titanium, and equivalent materials. The choice of the substrate material which will normally be tied to the specific application of the CNT devices formed thereon, that may be of a relatively large area, as for example, for a plasma-type flat panel display, wherein an array of CNT structures functions as a "cold" cathode, by emitting electric charges onto a juxtaposed phosphorous layer of the display.

The description will follow with relation to a particularly effective embodiment wherein the spaced conductive or semiconductive layers of materials of sufficiently different work function values are both of doped polysilicon. Such a material choice is relevant because of its compatibility with common fabrication processes of semiconductor devices and ability to be integratable on a common silicon substrate together with electronic passive and active structures to realize a so-called system-on-chip (SoC).

Indeed, the choice of the conductive or semiconductive material pair for ensuring a sufficiently intense electric field capable of directing the growth of the CNTs can be made from among materials other than doped silicon, and generally suitable pairs with characteristics suiting the requisites of the method of the embodiments, may be identified among the group including cobalt, nickel, iron, tungsten, platinum, rhodium, iridium, and gold. For example, the pair cobalt-tungsten and the pair platinum-nickel have a work function difference in the range of 0.22 and 0.68 eV, and of 0.08 and 0.89 eV, respectively, which is suitable to grow CNTs across a gap distance between opposing surfaces of the layers of different materials, from about 2,000 nm or even less, to about 4,000 nm.

Referring to the exemplary stack of the embodiment depicted in FIGS. 1-5, formed over a substrate 1 that may be a common monocrystalline silicon wafer, a first layer of n-type conductivity doped polysilicon 2 of a thickness that may be as small as 0.5 µm or even smaller is formed. The n-type dopant may be either arsenic or phosphorous, and the dopant concentration may be in a range from $10^{14}$ to $10^{21}$ atoms $cm^{-3}$.

Over the surface of the first layer 2 of n-type polysilicon, a catalytic metal (that in the illustrated embodiment is cobalt), is deposited by sputtering or by chemical vapor deposition, or alternatively even by thermoreduction of a precursor salt solution applied onto the surface of the layer 2 or by any other appropriate technique capable of favoring the deposition of nanosized particles or nanosized clusters of particles of the catalytic metal. The layer 3 of deposited densely and uniformly disposed catalytic metal particles or clusters may have a "thickness" ranging from 10 to 1000 Å.

The conditions of deposition of the catalytic metal and the amount of deposited catalyst may be tailored to favor the nucleation and growth of single walled nanotubes or multi-walled nanotubes. Over the catalyzed surface of the first polysilicon layer 2, a substantially sacrificial spacer layer 4 of a selectively etchable dielectric material, of a thickness equivalent to the length (height) of the ONTs to be formed, for example, silicon nitride as illustrated, is deposited. An alternative selectively etchable dielectric material may be silicon oxide, and, in general, any other selectively etchable nitride and oxide may be used.

Over the sacrificial dielectric spacer layer 4, a second layer 5 of polysilicon, doped with a p-type dopant, for example, with boron, in a concentration that may range from about $10^{14}$ to about $10^{21}$ atom $cm^{-3}$ is formed. The thickness of this second spaced layer of p-doped polysilicon of a different work function value compared to the work function value of the first n-doped layer 2 may also be as small as 0.5 µm or even less.

Such a basic multilayer stack, including the layers 2, 3, 4 and 5, optionally, as shown, over a substrate 1 of a solid material different from the first layer 2, may be patterned by common photolithographic techniques used in the semiconductor industry or by other less common lithographic techniques. For example, the patterning may define a closed packed array of individual pillars of any cross sectional shape, as the one depicted in FIG. 2.

Figure 3:
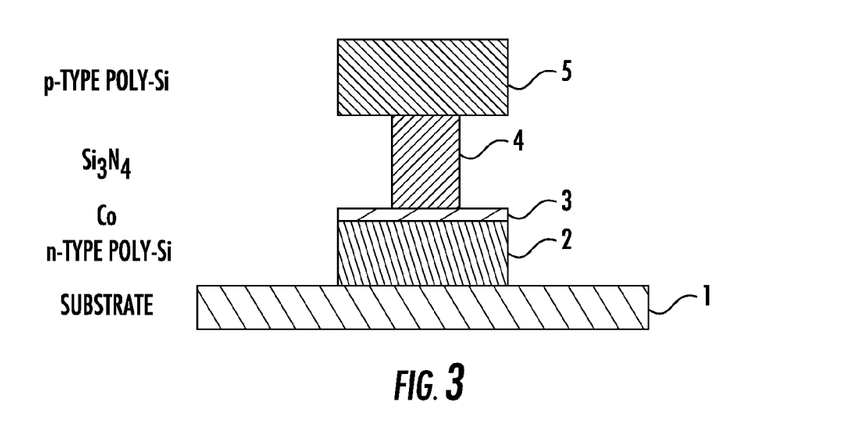

Thereafter, by selective isotropic etching of the silicon nitride of the dielectric spacer layer 4, that may commonly be performed by wet etching using, for example, a hot $H_3PO_4$ solution (e.g. at 165° C.), the silicon nitride is progressively etched (at a rate that in this case will be of about 40 Å/min) as far as leaving a slenderized residual central pillar or wall, adapted to sustain the overhanging patterned part of the second layer 5 of p-type polysilicon, as depicted in FIG. 3. As depicted in the figure, the progression of the isotropic wet etching exposes a substantial portion of the catalyzed surface area of the first n-type doped polysilicon layer 2 and of the overhanging second p-type doped polysilicon layer 5.

Figure 4:
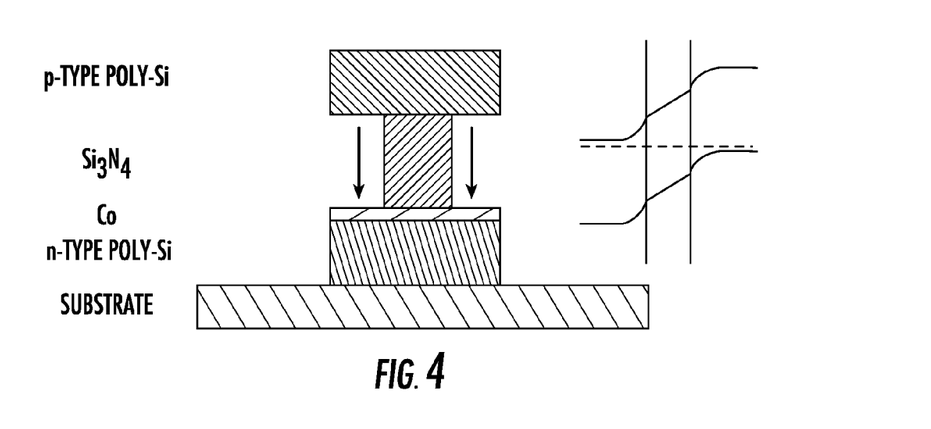
Figure 5:
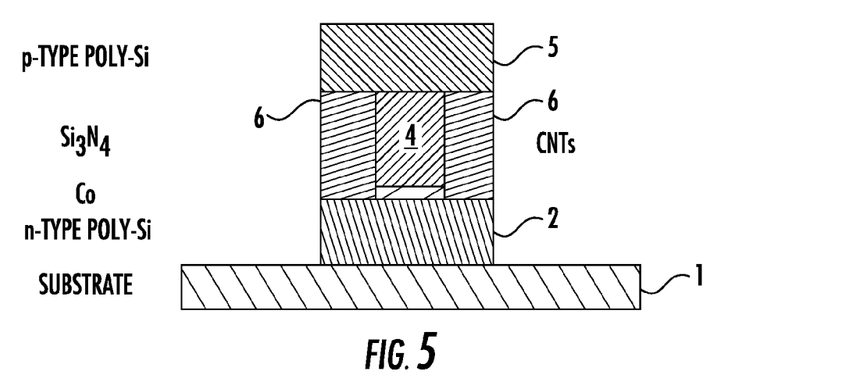
Figure 6:
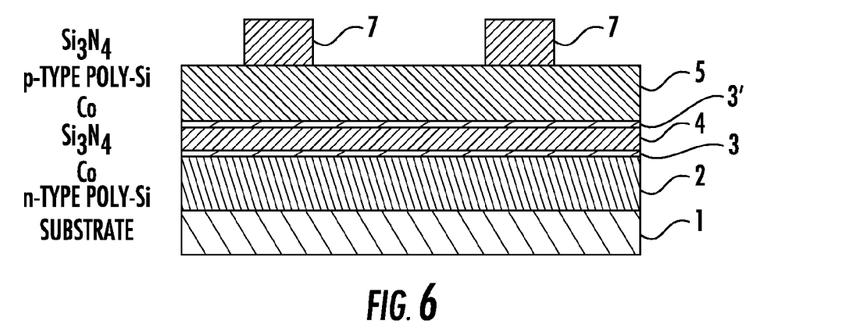
FIGS. 6 to 10 illustrate basic steps of a process of growing CNTs according to another embodiment of the present invention, and include a plurality of distinct CNT structures over a common substrate.
Figure 7:
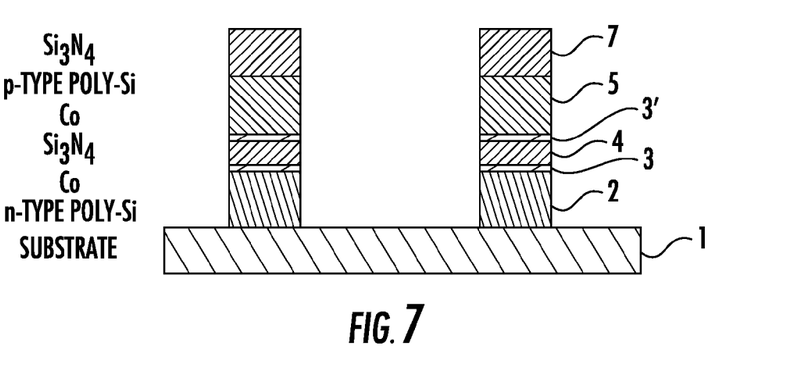
Figure 8:
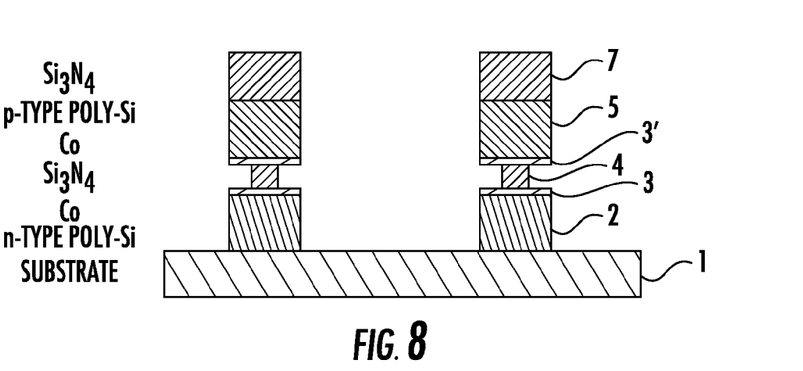
Figure 9:
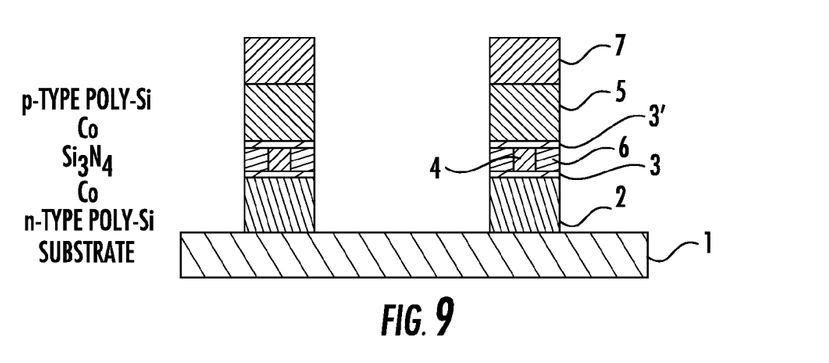

As schematically and diagrammatically depicted in FIG. 4, the separation gap space between the opposite surfaces of the two doped polysilicon layers 2 and 5, held separate by the residual pillar of dielectric material 4, is traversed by electric field force lines (ideally shown by the arrows) due to the contact potential difference caused by the difference of work function values of the n-type polysilicon of the first layer 2, and of the p-type polysilicon of the second layer 5. The electric field strength in the separation gap between the two spaced layers 2 and 5 should generally not be lesser than about 2 V/$\mu$m and preferably be of 5 V/$\mu$m or greater.

Having pre-arranged for a self-produced local directive electric field between a pair of spaced electrically conducting layers of sufficiently different work function value, catalytic chemical vapor deposition of carbon is conducted causing an initial nucleation of carbon deposit on finely distributed active sites defined by the deposited particles of catalyst (Co) over the surface of the first layer 2 of n-typed doped polysilicon, ensuring oriented growth in the separation gap along the electric field lines, toward the opposite surface of the overhanging layer 5 of p-type doped polysilicon that, by the contact potential difference, may be at a higher potential than the n-type doped polysilicon layer 2. The catalytic chemical vapor deposition process of carbon may be conducted under controlled conditions, using an appropriate carbon feedstock that may be chosen among compounds belonging to the group of camphor, naphthalene, acetylene, benzene, ethylene, methane, and carbon monoxide. Optionally, the carbon deposition process may be conducted in the presence of a vapor of ferrocene, cobaltocene, and/or nickelcene, acting as carbon deposition enhancing catalysts.

The growth-directing electric field, intrinsically produced without any external source, progressively increases as the opposing conductive end surfaces of the growing CNTs approach the surface of the p-type doped polysilicon layer 5, before dropping abruptly to nil, when a substantial population of grown CNTs reach the surface of the electrically conductive layer 5 of higher potential, determining a substantial equipotentiality of the two layers 2 and 5 and nullification of the contact potential difference growth-directing bias. This event will normally call for termination of the carbon deposition process such to leave a structure as the one depicted in FIG. 5.

Figure 10:
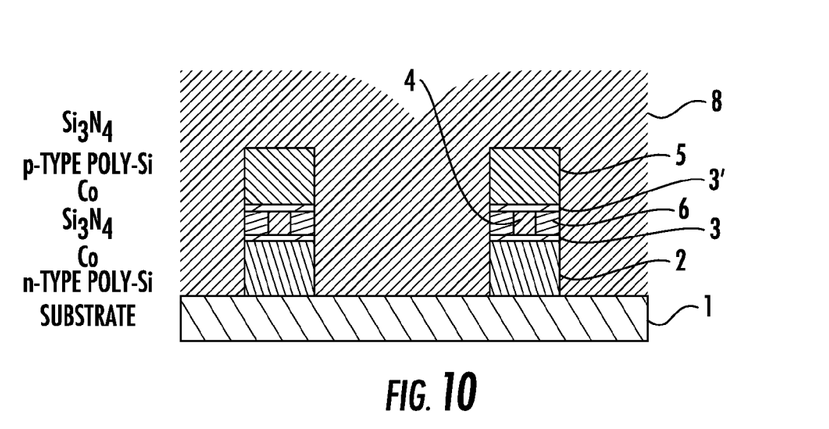

The series of figures from FIGS. 6 to 10, illustrates a similar sequence of basic process steps relative to an alternative embodiment of the method, according to which a second catalytic metal deposition step is conducted to deposit a second catalytic layer 3' of nanosized cobalt particles or clusters over the dielectric spacer layer 4 of silicon nitride, before forming, on the stack, the second layer 5 of p-type doped polysilicon. Moreover, the series of figures illustrates distinct CNT devices being simultaneously formed over a substrate of a relatively large area. It shall be noted that the same sacrificial dielectric material (silicon nitride in the exemplary embodiments illustrated) may be used as the partly sacrificial spacer layer 4, as well as a definable hard mask layer 6, for defining the different devices over the substrate 1, to become eventually set in an encapsulating dielectric layer 7 of silicon nitride, as depicted in FIG. 10.

Figure 19:
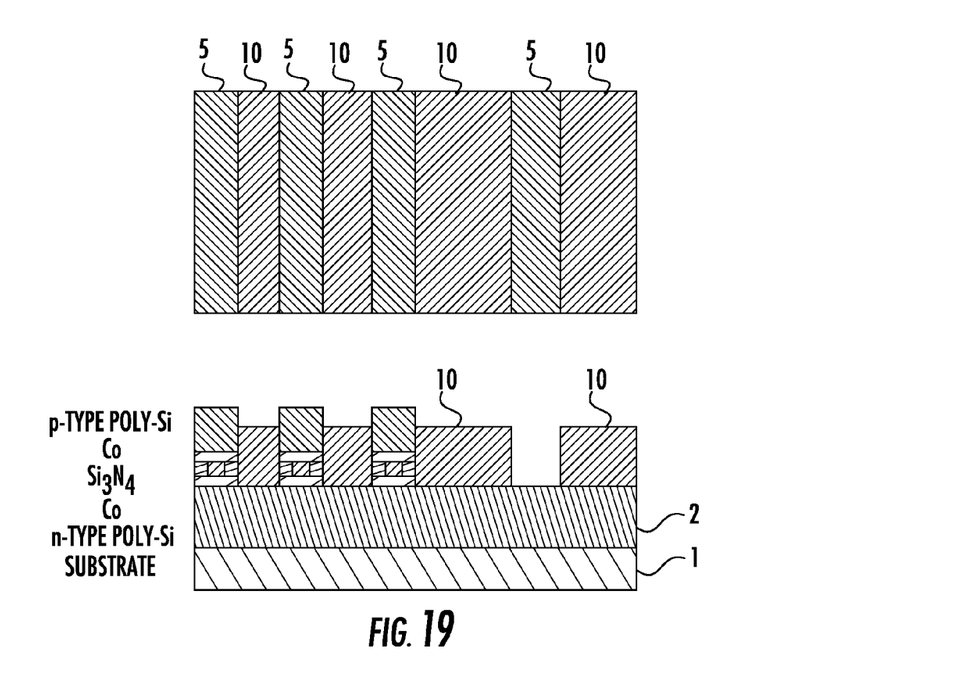
Figure 20:
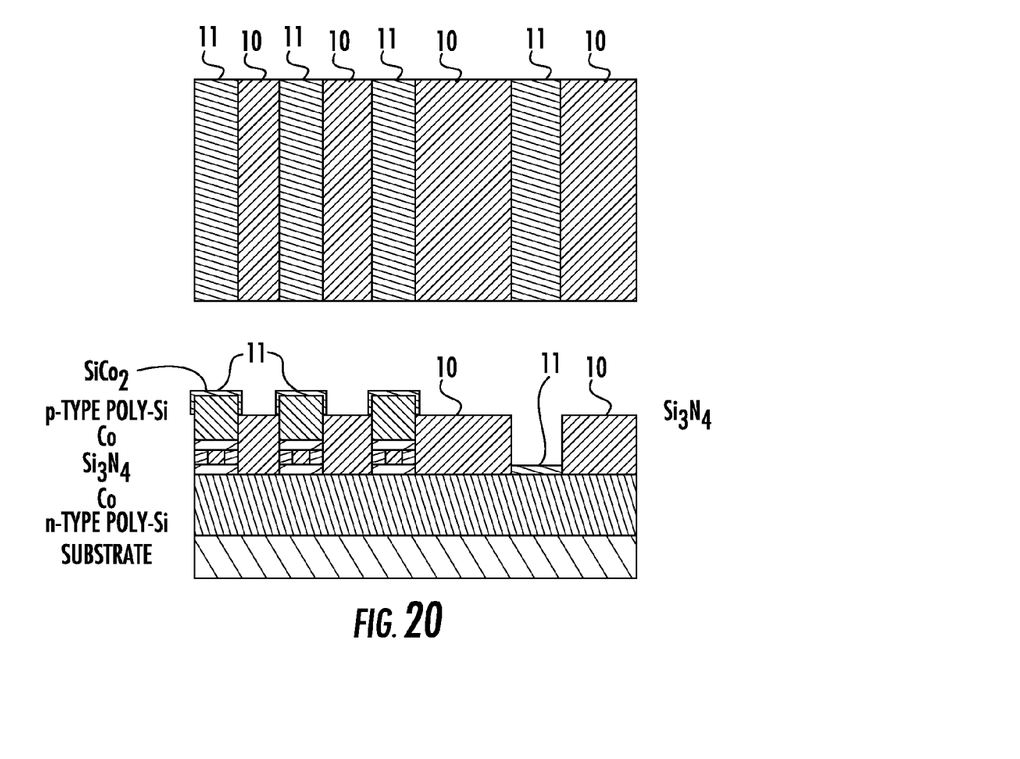
Figure 21:
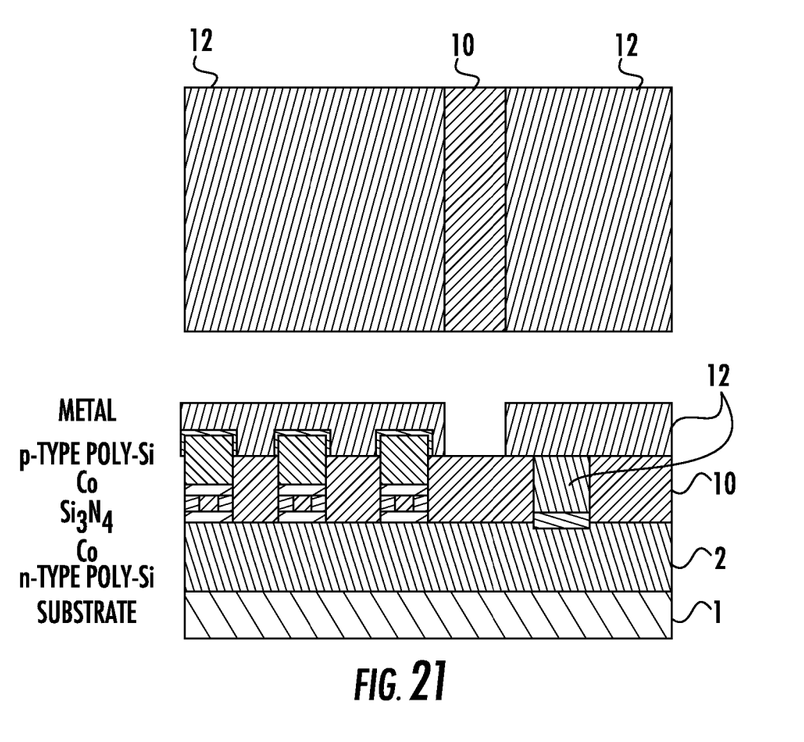

The series of layout and cross sectional views, from FIGS. 11 to 21, illustrates a sequence of basic fabrication steps, compatible with commonly practiced IC fabrication processes, for forming arrays of two-terminal CNT devices, to be electrically connected to an on-chip integrated circuit for forming a rectifier, a sensor, a logic device, etc., exploiting the peculiar physical-electrical characteristics of their CNT structure. The indicated nature of the materials used and the cross sectional views showing the type of fabrication step being performed, may permit a skilled reader, familiar with the deposition techniques and photolithographic patterning techniques of a last deposited layer and/or of several stacked layers, to read the series of illustrations and recognize the suitable techniques to be used for intervening on the different materials of the multilayered stack to arrive at an electrically interconnected array of integrated CNT devices, as depicted in FIG. 21, without reiterating detailed descriptions of the various steps.

Figure 11:
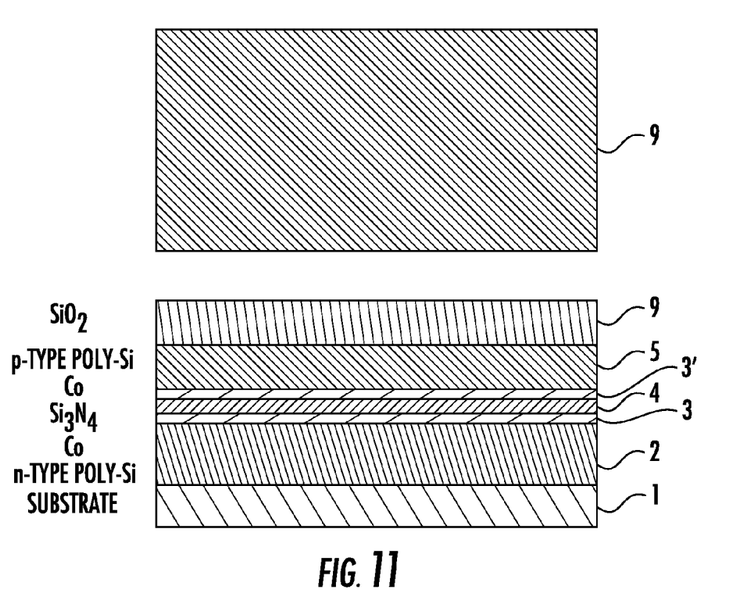
FIGS. 11 to 21 illustrate the fabrication of two-terminal devices on a common substrate for different applications of the electrical characteristics of CNTs in accordance with the present invention.
Figure 12:
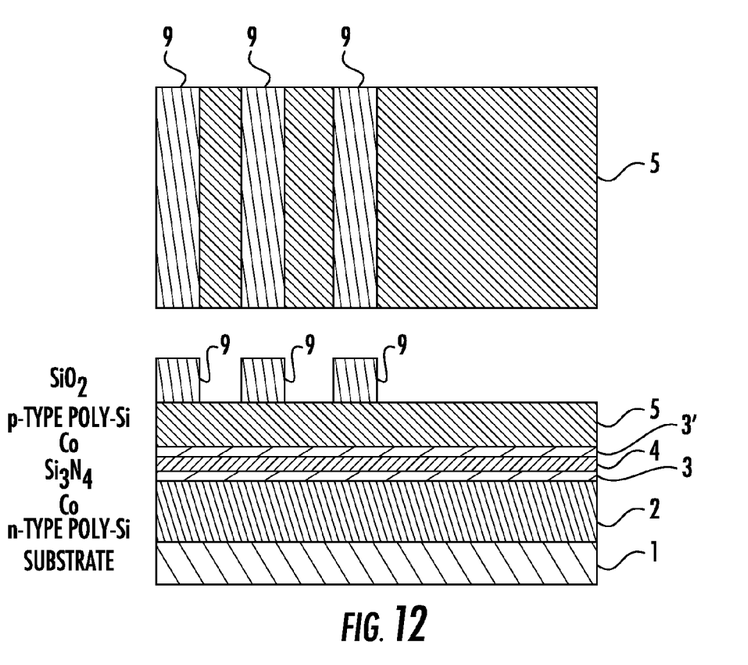

FIG. 11 shows a starting multilayered stack. FIG. 12 shows a certain pattern transferred over the stack by a mask of $SiO_2$. The pattern defines a left side area over which an array of CNT devices will be formed, and a right side area dedicated to the formation of a back or rear contact. Indeed, vertically structured CNT devices, having a top electrode and a bottom electrode, may require access to their bottom electrode.

Figure 13:
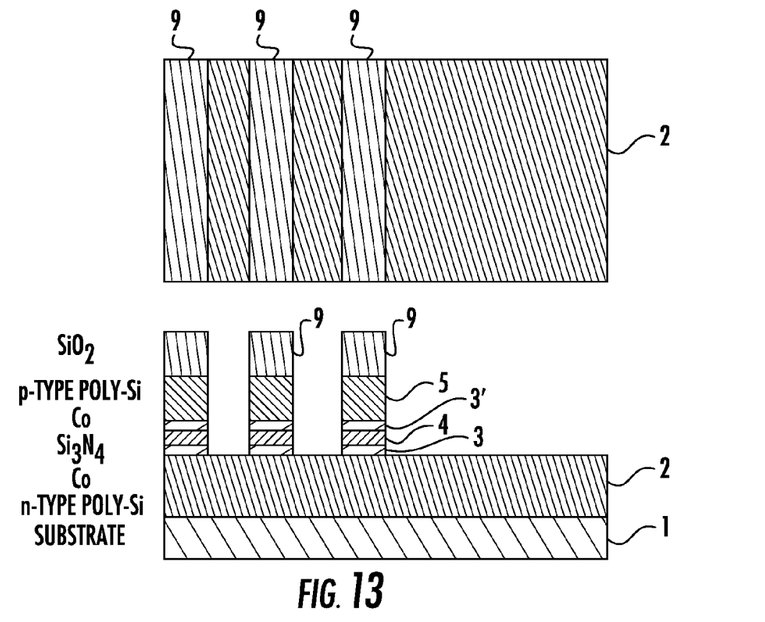
Figure 14:
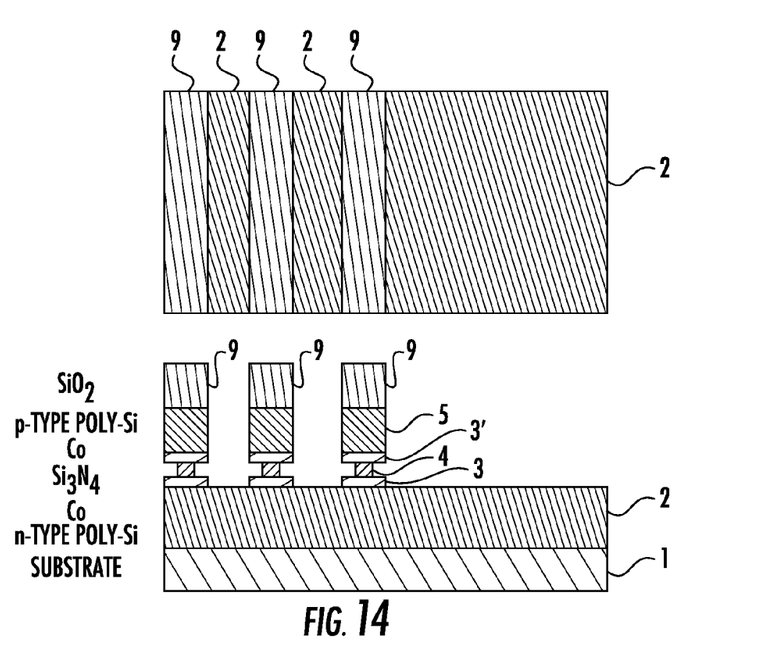
Figure 15:
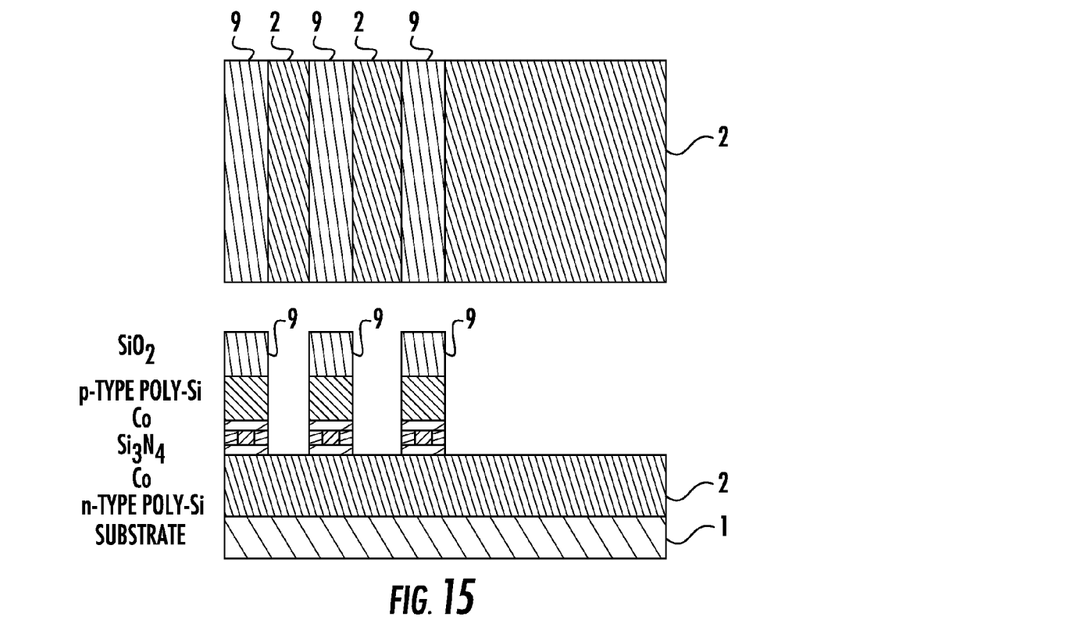

FIG. 13 shows how the pattern may be commonly transferred into the stacked layers by anisotropic plasma etching. FIG. 14 shows the result of a partial isotropic (wet) etching of the sacrificial layer that generates the separation gap space in which CNTs will be grown. FIG. 15 depicts the integrated structures at the conclusion of the CNTs growth process.

Figure 16:
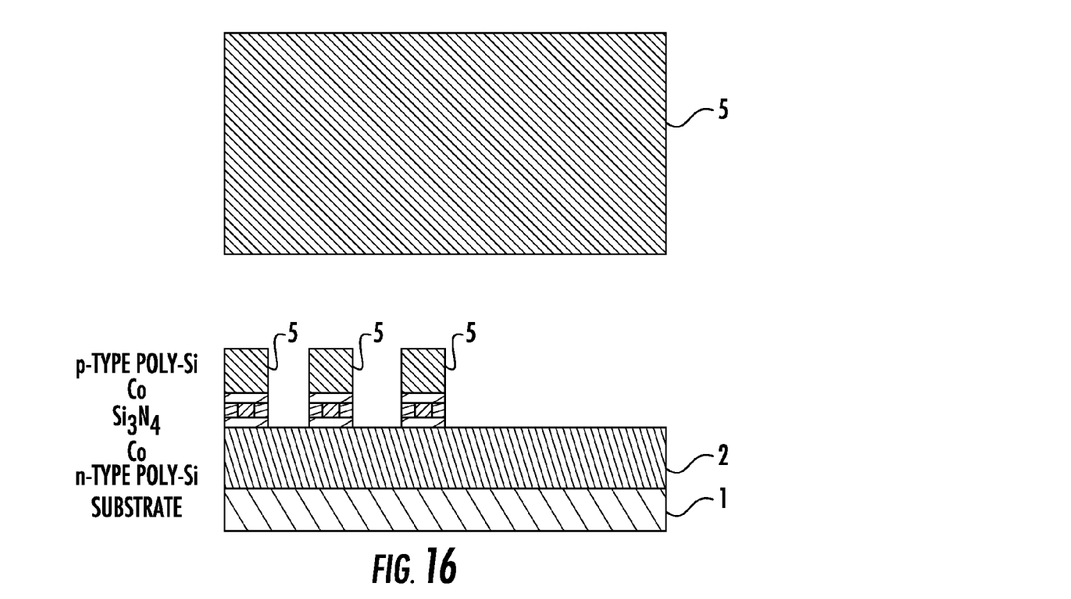
Figure 17:
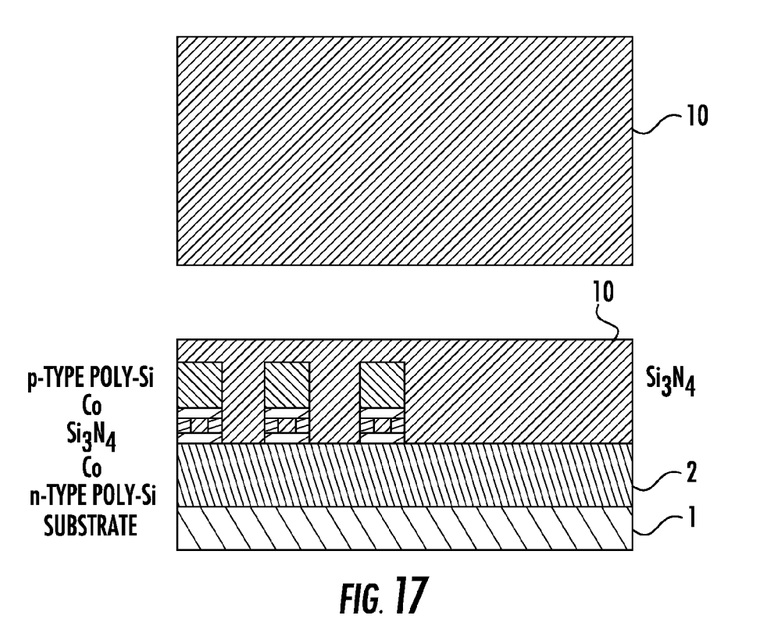
Figure 18:
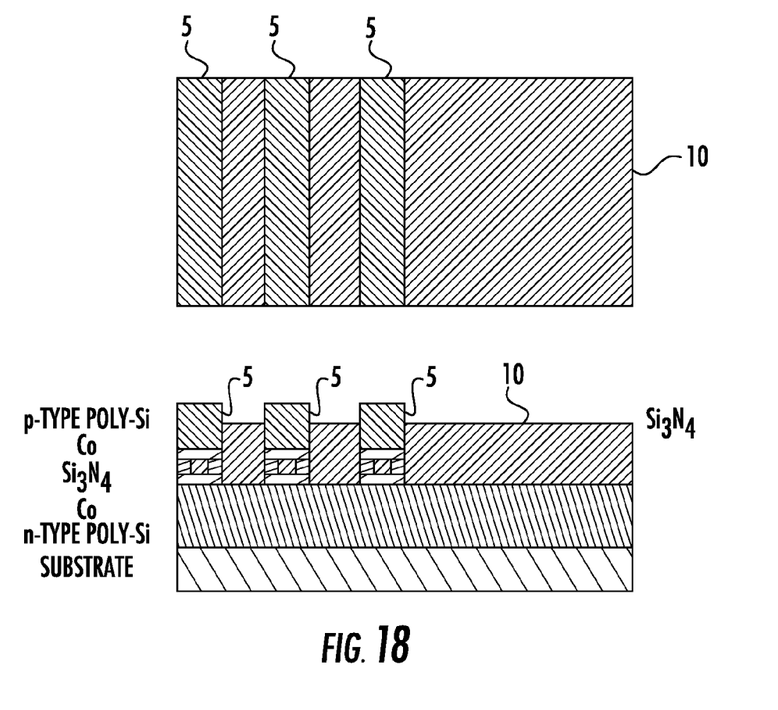

FIGS. 16 to 18 describe respectively: the etching off of the $SiO_2$ hard mask; deposition of an isolation layer of and subsequent planarization; and a time controlled selective etching of the silicon nitride of isolation. FIG. 19 describes the opening of vias to the bottom electrode layer. FIGS. 20 to 21 describe respectively: a silicide layer formation step; formation of the contact to the bottom electrode; and a metal deposition step and subsequent definition.

Although the most interesting characteristic of CNTs is their field-emission capability, which makes them promising candidate structures for nanotube-based flat-panel displays, there have been numerous publications concerning nanotubes based transistors. Their ability as a hydrogen storage material and/or as effective fuel cell electrode constituents has also been demonstrated.

The method of this disclosure offers an outstandingly simple and effective way to manufacture functional CNT-based devices for integration in system-on-chip applications such as, for example, vertical selectors for high density memories, vertical channel FETs, sensors, and flat panel displays and similar devices.

The article "Nanotubes and the Pursuit of Applications" by Walt A. de Heer, and the article "Recent Advances in Methods of Forming Carbon Nanotubes", by Jie Liu et al., MRS Bulletin/April 2004, provides specific reviews of CNT related literature.

That which is claimed:

1. An electronic device comprising:
  a first layer having a first work function value;
  a second layer above said first layer and having a second work function value different from the first work function value;
  at least one pillar extending between and connected to said first and second layers; and
  a plurality of nanosized filamentary carbon structures surrounding said at least one pillar and extending between said first and second layers.

2. The electronic device according to claim 1 wherein at least one of said first and second layers comprises metal.

3. The electronic device according to claim 1 wherein at least one of said first and second layers comprises a semiconductor.

4. The electronic device according to claim 1 wherein said first layer comprises polysilicon having a first conductivity type; and wherein said second layer comprises polysilicon having a second conductivity type.

5. The electronic device according to claim 1 wherein at least one of said first and second layers comprises at least one of doped silicon, cobalt, nickel, iron, molybdenum, tungsten, platinum, rhodium, iridium, gold, and alloys thereof.

6. The electronic device according to claim 1 wherein said at least one pillar comprises a dielectric.

7. The electronic device according to claim 1 wherein said at least one pillar comprises at least one of a nitride and an oxide.

8. The electronic device according to claim 1 wherein said at least one pillar comprises at least one of silicon nitride and silicon oxide.

9. The electronic device according to claim 1 further comprising a catalyst layer between said at least one pillar and at least one of said first and second layers.

10. The electronic device according to claim 9 wherein said catalyst layer comprises at least one of iron, nickel, cobalt, platinum, palladium, rhodium, gadolinium and lanthanum.

11. The electronic device according to claim 1 further comprising a substrate below said first layer.

12. The electronic device according to claim 11 wherein said substrate comprises at least one of silicon, silica, quarts, alumina, porous silicon, zeolite, sapphire, stainless steel, hastelloy, and titanium.

13. An electronic device comprising:
a first layer comprising polysilicon having a first conductivity type;
a second layer above said first layer and comprising polysilicon having a second conductivity type;
at least one dielectric pillar extending between said first and second layers; and
a plurality of nanosized filamentary carbon structures surrounding said at least one pillar and extending between said first and second layers.

14. The electronic device according to claim 13 wherein said at least one dielectric pillar comprises at least one of a nitride and an oxide.

15. The electronic device according to claim 13 wherein said at least one dielectric pillar comprises at least one of silicon nitride and silicon oxide.

16. The electronic device according to claim 13 further comprising a catalyst layer between said at least one dielectric pillar and at least one of said first and second layers.

17. The electronic device according to claim 16 wherein said catalyst layer comprises at least one of iron, nickel, cobalt, platinum, palladium, rhodium, gadolinium and lanthanum.

18. The electronic device according to claim 13 further comprising a substrate below said first layer.

19. The electronic device according to claim 18 wherein said substrate comprises at least one of silicon, silica, quarts, alumina, porous silicon, zeolite, sapphire, stainless steel, hastelloy, and titanium.

20. An electronic device comprising:
a substrate;
a first layer on said substrate and having a first work function value;
a second layer above said first layer and having a second work function value different from the first work function value;
at least one dielectric pillar extending between said first and second layers; and
a plurality of nanosized filamentary carbon structures surrounding said at least one dielectric pillar and extending between said first and second layers.

21. The electronic device according to claim 20 wherein at least one of said first and second layers comprises metal.

22. The electronic device according to claim 20 wherein at least one of said first and second layers comprises a semiconductor.

23. The electronic device according to claim 20 wherein said first layer comprises polysilicon having a first conductivity type and wherein said second layer comprises polysilicon having a second conductivity type.

24. The electronic device according to claim 20 wherein at least one of said first and second layers comprises at least one of doped silicon, cobalt, nickel, iron, molybdenum, tungsten, platinum, rhodium, iridium, gold, and alloys thereof.

25. The electronic device according to claim 20 wherein said at least one dielectric pillar comprises at least one of a nitride and an oxide.

26. The electronic device according to claim 20 wherein said at least one dielectric pillar comprises at least one of silicon nitride and silicon oxide.

27. The electronic device according to claim 20 further comprising a catalyst layer between said at least one dielectric pillar and at least one of said first and second layers.

28. The electronic device according to claim 27 wherein said catalyst layer comprises at least one of iron, nickel, cobalt, platinum, palladium, rhodium, gadolinium and lanthanum.

29. The electronic device according to claim 20 wherein said substrate comprises at least one of silicon, silica, quarts, alumina, porous silicon, zeolite, sapphire, stainless steel, hastelloy, and titanium.

* * * * *